United States Patent [19]

van Santen

[11] 4,168,444
[45] Sep. 18, 1979

[54] IMAGING DEVICES

[75] Inventor: Johannes G. van Santen, Eindhoven, Netherlands

[73] Assignee: U.S. Philips Corporation, New York, N.Y.

[21] Appl. No.: 813,837

[22] Filed: Jul. 8, 1977

[30] Foreign Application Priority Data

Aug. 19, 1976 [GB] United Kingdom ............... 34599/76

[51] Int. Cl.² ...................... H03K 3/42; G11C 19/28; H01L 29/78; H01L 27/14
[52] U.S. Cl. ............................. 307/311; 307/221 D; 357/24; 357/30; 357/59; 250/211 J
[58] Field of Search ............... 357/24, 30; 307/221 D, 307/311; 250/211 J

[56] References Cited

U.S. PATENT DOCUMENTS

| | | | |
|---|---|---|---|
| 3,796,932 | 3/1974 | Amelio et al. | 357/24 |
| 3,796,933 | 3/1974 | Arnett et al. | 357/24 |
| 3,896,474 | 7/1975 | Amelio et al. | 357/24 |
| 4,028,716 | 6/1977 | van Santen et al. | 357/24 |
| 4,067,001 | 1/1978 | Hoffman | 357/24 |

FOREIGN PATENT DOCUMENTS

| | | | |
|---|---|---|---|
| 2555881 | 6/1976 | Fed. Rep. of Germany | 357/24 |
| 2606308 | 8/1977 | Fed. Rep. of Germany | 357/24 |

OTHER PUBLICATIONS

Heller et al., "Ramp Potential MIS Device", IBM Tech. Disclosure Bulletin, vol. 13 (4/71), p. 3559.
Heller et al., "Random Access Potential Ramp Memory for Charge-Coupled Devices", vol. 14 (7/71), pp. 485-486.
Sequin et al., Charge Transfer Devices, Academic Press, N.Y. (7/75), pp. 154-157.

Primary Examiner—Joseph E. Clawson, Jr.
Assistant Examiner—Gene M. Munson
Attorney, Agent, or Firm—Thomas A. Briody; Edward J. Connors, Jr.; Steven R. Biren

[57] ABSTRACT

An imaging device includes a semiconductor body and a array of photosensitive elements arranged in rows and columns at a first portion of the body. A plurality of charge-transfer lines interdigitated with the columns of the array are provided for transfering storage charge carriers from the array to a charge-transfer shift register at a second portion of the semi-conductor body. Each of the transfer lines includes an elongate resistor electrode which has connections for applying a potential difference along the resistive electrode to produce a drift field in the underlying body portion in the direction of the shift register for transporting mobile charge carriers toward the shift register.

11 Claims, 11 Drawing Figures

IMAGING DEVICES

This invention relates to imaging devices comprising a semiconductor body, an array of photosensitive elements arranged in rows and columns at a first portion of said body for generating and storing mobile charge carriers in response to incident radiation, first means for transferring stored charge carriers from said array to another portion of said body, which first means include charge-transfer lines interdigitated with the columns of said array, and second means defining at said other portion of the body a charge-transfer shift register which receives from said first means a parallel input of the charge storage information of a row of said array and provides a serial output of said information.

The invention also relates to a circuit arrangement comprising such an imaging device. U.S. Pat. No. 3,896,474 and British Patent Specification No. 1,394,520 describe examples of such devices. Because the charge-transfer lines are interdigitated with the column lines of the photosensitive element array such imaging devices are sometimes described as being of the "inter-line type", or having an "interleaved-structure".

The charge-transfer lines in these known devices are shift registers, for example two-phase charge-coupled device (C.C.D.) shift-registers. After collecting and storing the generated charge-carriers for a period known as the frame period, the charge-storage information of the whole array of photosensitive elements may be simultaneously transferred into these parallel shift-register lines. Then during the next frame period this information is shifted along these lines to input the charge-storage information of each row sequentially into the other charge-transfer shift register which provides said serial output. The advantages of such a charge-transfer imaging device are known.

However, such CCD shift registers integrated with the photosensitive element array in the same area of the semiconductor body can constitute a disadvantage. The provision of interconnected clocking electrodes for the multi-phase CCD lines can result in a complex multilevel insulated electrode pattern which may be difficult to fabricate. Moreover, said pattern may overlie parts of the photosensitive elements or occupy a significant space between the columns of photosensitive elements. Thus, the incident radiation may be required to penetrate several layers of electrode material and insulating material before generating the charge carriers in the photosensitive elements. This can result in absorption and/or reflection of the radiation depending on the nature of the materials used. Even when polycrystalline silicon is used for the electrode material instead of metal, shorter wavelength radiation such as blue light can be significantly absorbed in transmission through more than one such electrode layer so reducing the blue sensitivity of the imaging device. The body portions occupied by these shift registers are preferably shielded from the incident radiation to avoid smearing of the charge-storage information during read-out. Thus, if most of the complex insulated electrode pattern is confined to the space between the columns of photosensitive elements, a significant percentage of the body area containing the photosensitive element array would be nonphotosensitive so that significant portions of the incident radiation pattern may be undetected, and the maximum number of photosensitive elements per surface unit is restricted. Furthermore, in some forms, an additional transfer gate is necessary between the photosensitive elements and their interdigitated shift registers so resulting in further spacing of the photosensitive element columns.

The present invention is based inter alia on the recognition that by transferring the charge-storage information from a photosensitive area of an imaging device by charge transportation along a drift field below an elongate electrode, a simple and compact charge-transfer line can be formed which need not occupy a large portion of the photosensitive area nor overlie a significant part of the photosensitive element.

According to the present invention a device of the kind mentioned in the preamble is characterized in that means are present for transferring the charge storage information of each row of the array separately into said transfer lines, and each of said transfer lines comprises an elongate resistive electrode which is insulated from the underlying portion of said body and extends alongside its associated column of said array, said resistive electrode being provided with connections for applying a potential difference along said resistive electrode to produce in said underlying body portion a drift field in the direction of said shift register for transporting said mobile charge carriers towards said shift register.

The barrier layer is preferably an insulating layer, but it may also be, for example, a Schottky junction or a p-n junction formed between the elongate electrode and the underlying semiconductor body portion. The drift-field may be produced by a doping gradient in the semiconductor body portion, a varying thickness or charge-state of an insulating barrier layer, or a potential-difference along the elongate electrode.

A preferred embodiment is characterized in that means are present for transferring the charge storage information of each row of the array separately into said transfer lines, and each of said transfer lines comprises an elongate resistive electrode which is insulated from the underlying portion of said body and extends alongside its associated column of said array, said resistive electrode being provided with connections for applying a potential difference along said resistive electrode to produce in said underlying body portion a drift field in the direction of said shift register for transporting said mobile charge carriers towards said shift register.

The application of a potential difference along such a resistive electrode is a simple way of obtaining such a drift field for the charge-transportation, and such a resistive-electrode charge-transfer line can be fabricated in a simple manner. In contrast with most of the previously-described known imaging devices of inter-line type the charge-storage information of the whole array is not simultaneously transferred to said charge-transfer lines, but the information of each row is tranferred separately so that at any one time during read-out only the charge-storage information of one photosensitive element is being transported along each line. This separate transfer of each row can be effected in a simple manner without requiring additional electrodes when each row of photosensitive elements has a common photogate electrode which provides both for storing the charge carriers at the photosensitive element and for transferring the stored charge carriers to the transfer lines.

It is advantageous for said first means to include a buffer for temporarily storing the charge-storage information of a row before introduction into said shift register, said buffer having an input gate from the resistive-electrode transfer lines and an output gate to the shift register. Such a buffer permits the charge-storage information of one row to be read-out from said shift register while transferring the information of the next row along the lines and into said buffer. In addition since antiblooming arrangements can be readily incorporated in devices in accordance with the invention, such a buffer also permits storage of the information of one row in the buffer before introduction into said shift register while simultaneously draining away excessive charge-carriers from over-exposed photosensitive elements.

For some imaging applications charge-transfer along the semiconductor surface may be acceptable. Preferably, however, the charge-transfer will take place via the interior of the body at a distance from the surface so as to avoid charge-trapping surface states and improve the efficiency and speed of transfer. Thus, the portion of the body underlying each of said elongate electrodes and in which said drift field is produced may be a surface-adjoining semiconductor region of one conductivity which is surrounded by a semiconductor body portion of the opposite conductivity type and which can be fully depleted without avalanche multiplication in order to allow transfer of said charge-storage information through said region as charge carriers of said one conductivity which drift via the interior of said region below said elongate electrode. Such a region of the one conductivity type can also be advantageously extended to provide a bulk charge-transfer channel for said shift-register, a surface-adjacent portion of each photosensitive element associated with said transfer line, and an anti-blooming drain for excessive charge carriers generated at over-exposed photosensitive elements. The body portion below each elongate electrode may provide a common charge-transfer channel for both the charge-storage information to be transferred and said excessive charge carriers to be drained or it may be divided into separate channels each for one of said functions.

Embodiments of the present invention will now be described by way of example with reference to various embodiments and the accompanying diagrammatic drawing, in which.

Figure 9:
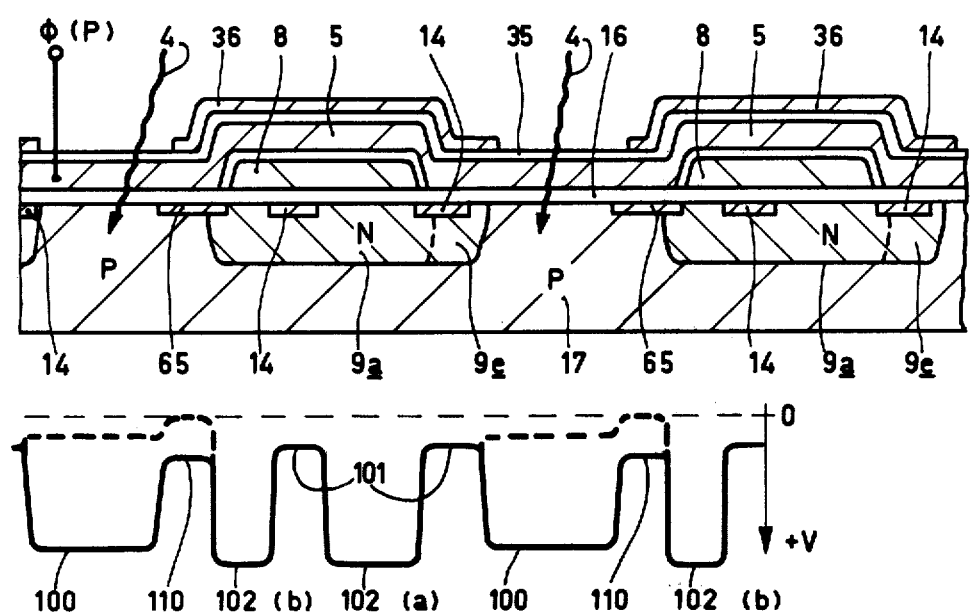
Figure 10:
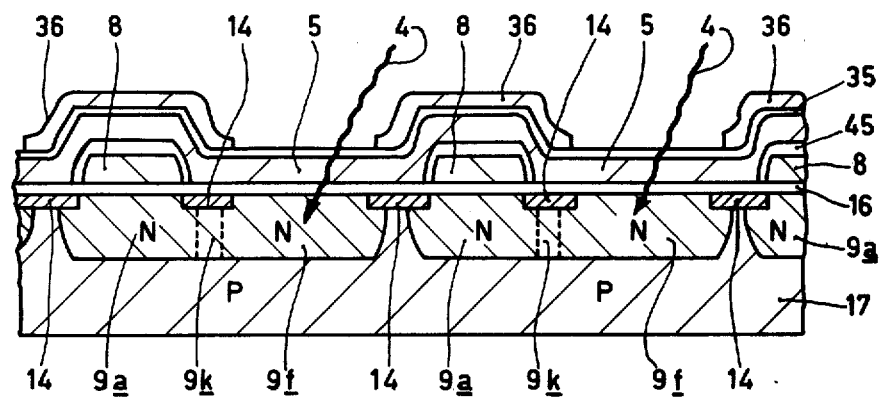
Figure 11:
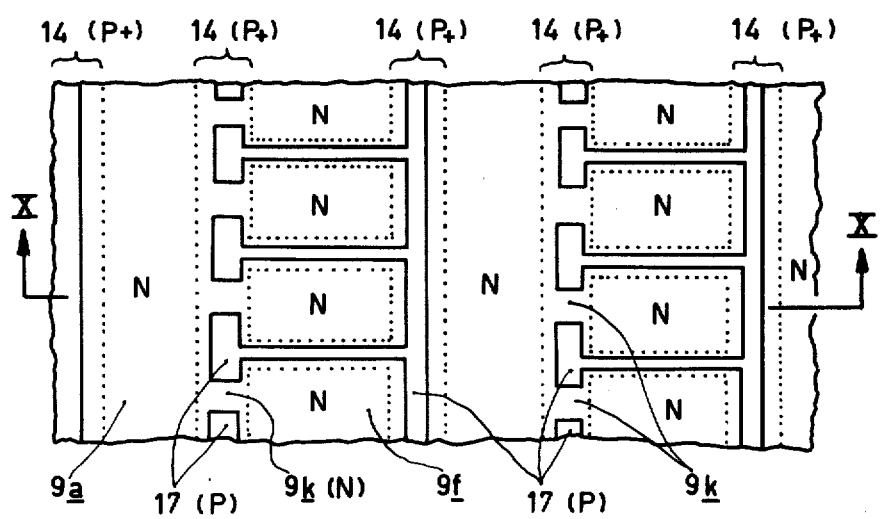

FIG. 9 is a cross-section along part of a row of photosensitive elements of another imaging device in accordance with the invention with associated potential profiles, and FIGS. 10 and 11 are cross-sectional and cut-away plan views respectively of part of an array of photosensitive elements of a further imaging device in accordance with the invention, the cross-section of FIG. 10 being taken on the line X—X of FIG. 11 along part of a row of the photosensitive elements.

It will be appreciated that the drawings are diagrammatic and not to scale, and the dimensions of some regions and layers having been exaggerated with respect to others for the sake of clarity.

Figure 1:
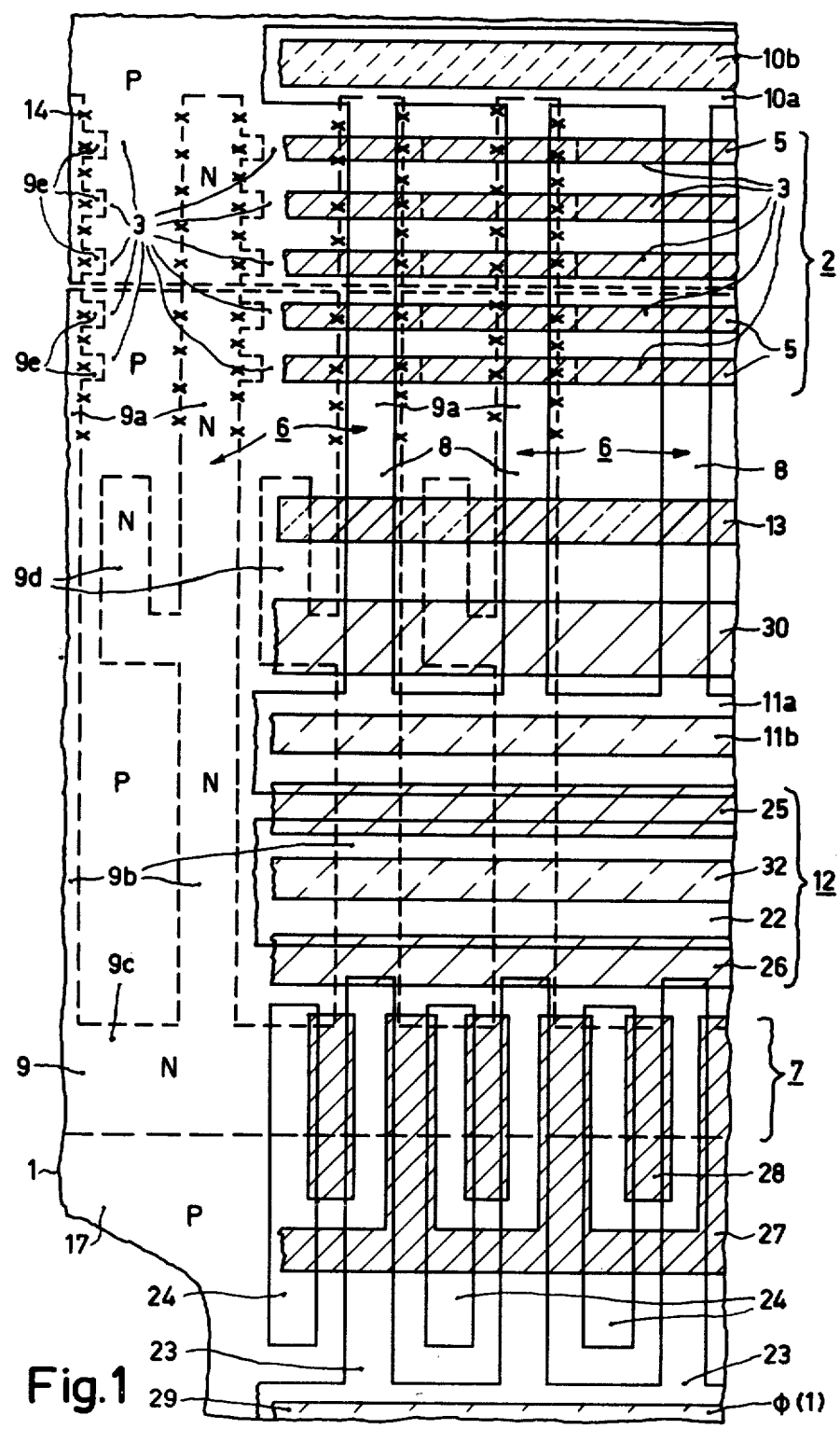
FIG. 1 is a partly cut-away plan view of a portion of an imaging device in accordance with the present invention.

The solid-state imaging device of FIGS. 1 to 4 comprises a semiconductor body 1 which is typically of monocrystalline silicon. An array 2 of photosensitive elements 3 organized in rows and columns are present at a first portion of the body 1 for generating and storing mobile charge carriers in response to incident radiation 4, see FIGS. 1 and 2. For the sake of clarity FIG. 1 shows only the top three and bottom two rows of said array; it will be appreciated that other rows of similar photosensitive elements are present therebetween. In this embodiment the individual rows are defined by a plurality of parallel photo-gate electrodes 5 each of which extends along and is common to a row of photosensitive elements 3.

Charge-transfer lines 6 are interdigitated with the columns of the array 2 and form part of a first means for transferring stored charge from the rows of the array 2 to another portion of the body 1 where a charge-transfer shift register 7 is provided. The shift register 7 which is of the CCD type and receives under the electrodes of its clocking line $\phi(1)$ a parallel supply of packets of charge information of a row of the array 2, which packets provide at the output 31 a serial read-out of said information. The area-imaging device of FIGS. 1 to 4 is therefore of the inter-line type and has an interleaved structure. With the photo-gate electrodes 5 common to each row of photosensitive elements 3 the charge-storage information of each row of the array 2 can be transferred separately into the transfer lines 6.

Each of the charge-transfer lines 6 comprises an elongate resistive electrode 8 which is insulated from the underlying portion 9a of the body 1 and extends alongside its associated column of the array 2. The electrodes 8 are provided with connections 10 and 11 for applying a potential drop along each electrode 8 to produce in the underlying body portion 9a an electrical drift field in the direction of the shift-register 7 for transporting the charge information towards the shift-register 7.

The structure and operation of the embodiment illustrated in FIGS. 1 to 4 will now be described in greater detail.

The body portion 9a forms part of a region 9 which is of one conductivity type (for example n-type), adjoins one surface 15 of the body 1 and is surrounded by a body portion 17 of the opposite conductivity type (p-type). The region 9 has such a doping and thickness that by means of an electric field a depletion layer can be obtained throughout its thickness while avoiding avalanche multiplication and breakdown, so allowing transfer of charge-storage information via the interior of the region 9 as charge-carriers of said one conductivity type (electrons). The n-type region 9 thus provides a bulk channel for the transfer of electrons from the photosensitive array 2 to the output 31 of charge-transfer register 7. Bulk-channel charge-transfer devices and their mode of operation are described in for example British Patent Specification No. 1,414,183 corresponding to U.S. Ser. No. 866,004, which is a continuation of U.S. Ser. No. 504,372, now abandoned, which is in turn a continuation of U.S. Ser. No. 299,748, now abandoned, to which reference is invited. The portions 9a of region 9 underlie the resistive electrodes 8 and extend between the columns of photosensitive elements 3. Portions 9b of region 9 are associated with a buffer 12 between the charge-transfer lines 6 and the shift register 7. Portions 9c of region 9 constitute the channel of the shift register 7. The portions 9a and 9b together constitute stripes which extend into the photosensitive element array 2 from the channel portion 9c of the register 7. In the cut-away plan view of FIG. 1, the region 9 is shown in broken outline; the left-hand n-type stripes 9a, b of FIG. 1 are shown without the overlying insulated electrode patterns, the center two n-type stripes 9a, b are shown with the associated electrode patterns, and for the sake of clarity the n-type stripe associated with the electrode pattern at the right of FIG. 1 is not shown. As shown in FIG. 1, each stripe 9a, b has an L-shaped lateral extension 9d between the photosensitive element array 2 and the buffer 12. This extension 9d which is provided with a drain connection 13 serves to drain away from the channel portion 9a of transfer line 6 any excessive electrons produced at an over-exposed photosensitive element 3 associated with the line 6.

Figure 2:
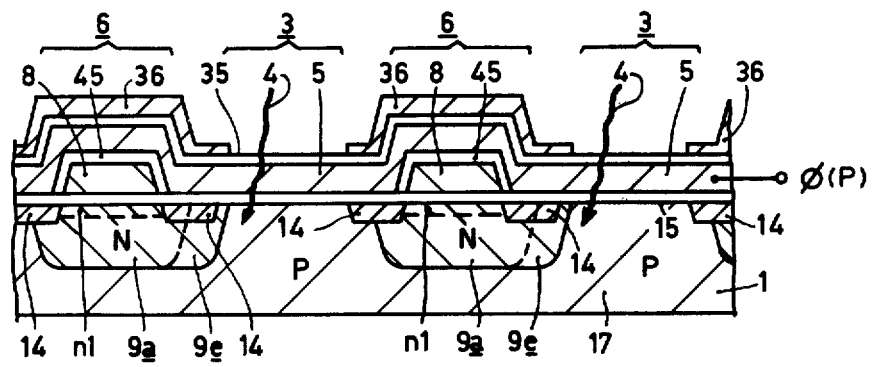
FIG. 2 is a cross-section along part of a row of photosensitive elements of the device of FIG. 1, and additionally shows an associated potential profile.
Figure 2:
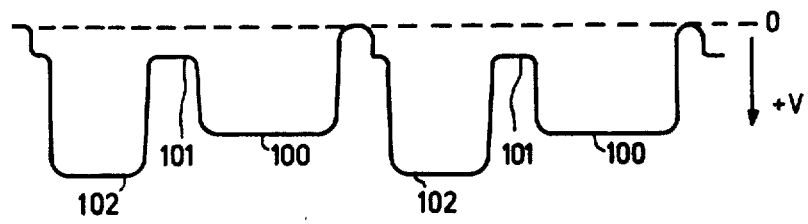
Figure 3:
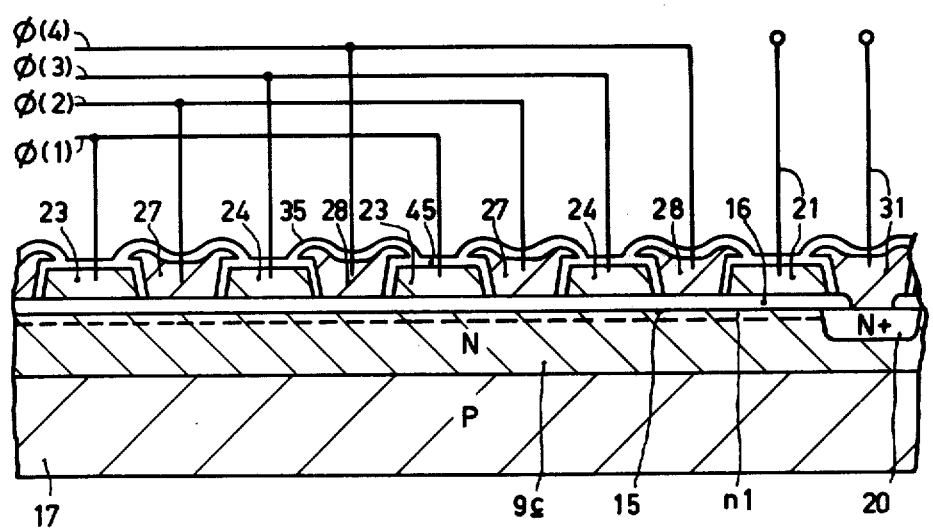
FIG. 3 is a cross-section along part of the output shift-register of the device of FIG. 1.
Figure 4:
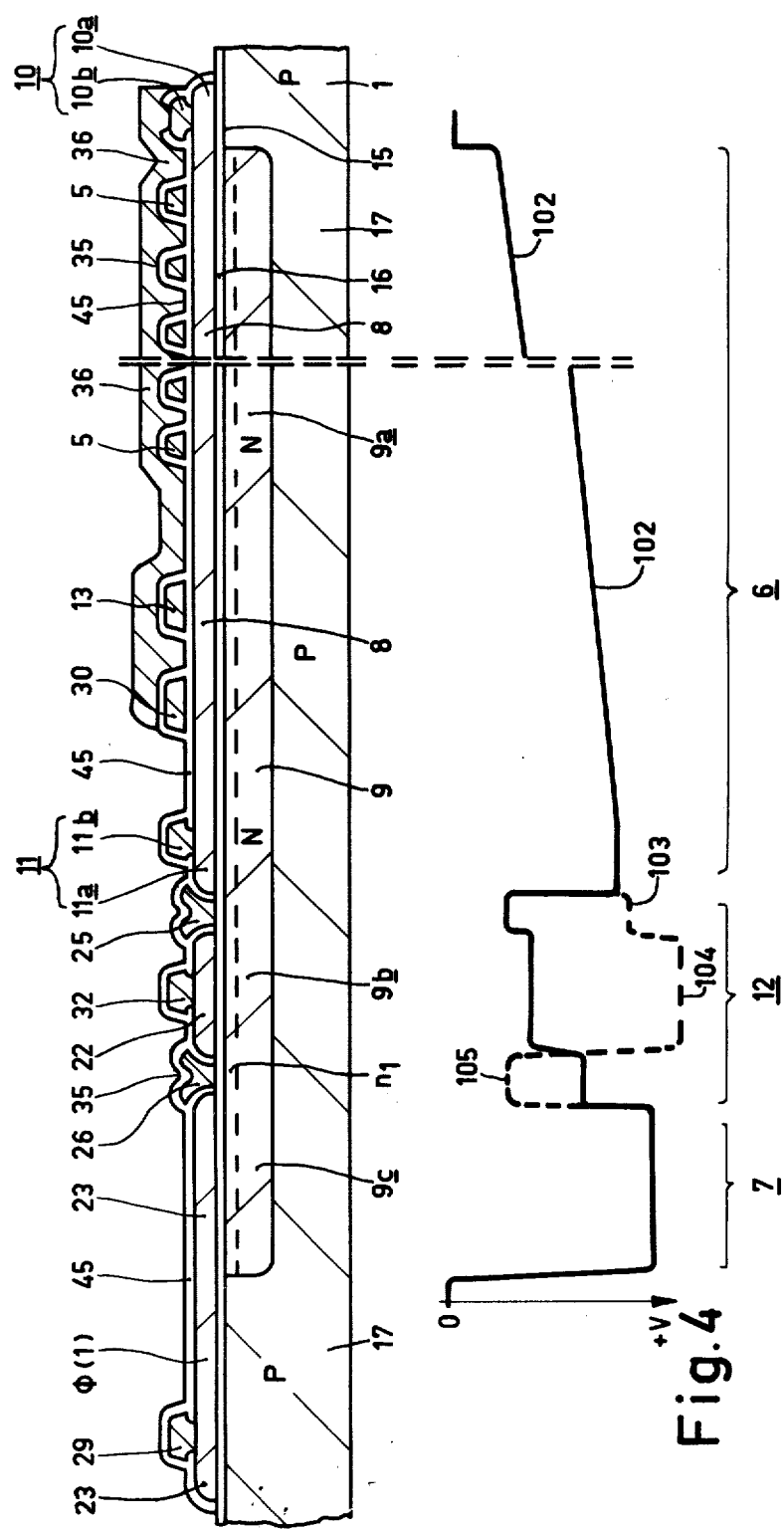
FIG. 4 is a cross-section along a resistive-electrode transfer-line and across the output shift-register of the device of FIG. 1 with associated potential profiles.

A more highly doped n-type zone may be provided locally at the surface of the n-type region 9 both at the output 31 of the shift-register 7 (see zone 20 in FIG. 3) and in each drain extension 9d of region 9 where it is contacted by the drain connection 13. Preferably, the whole surface of the whole region 9 has a more highly doped surface zone $n_1$ as shown in FIGS. 2, 3 and 4. As is known, by providing such a higher-doped surface zone $n_1$ the bulk transfer channel can be formed with an advantageous doping profile, for example as described in co-pending British Patent Application No. 11974/74 corresponding to published Dutch Application No. 7303778 and U.S. Pat. No. 4,012,759. In addition, due to the presence of said more-highly doped surface zone $n_1$, the value of the potential difference capacitively-produced in the body portion 9a below the resistive electrodes 8 can correspond more closely to that applied along said electrodes 8. In a typical case, the bulk of the n-type region 9 may have for example a doping of $10^{15}$ donor atoms per c.c. and a depth of 3 microns, while those of the surface zone $n_1$ may be for example $2 \times 10^{12}$ donor atoms per sq. cm. in a depth of 0.3 to 0.4 micron.

One side of the portions 9a of n-type region 9 between the columns of photosensitive elements 3 is castellated as shown in FIG. 1. These castellations 9e extend below the photogate electrodes 5 of the photosensitive elements 3. A highly-doped surface-adjoining zone 14 of opposite conductivity type (p+) is provided around the boundary of the n-type portion 9a at surface 15. Except at the castellations 9e this p-type zone 14 is in contact with both the p-type body portion 17 and the n-type region portion 9a. Where zone 14 meets each castellation 9e, it extends across the castellation 9e. This p+ zone 14 is shown in cross-section in FIG. 2, but for the sake of clarity it is only indicated in FIG. 1 by a line of crosses which merges with broken outline of region 9a. As will be explained hereinafter the p+ zone 14 serves to determine potential barriers associated with each photosensitive element 3. If desired, a similar p+ zone may also be provided along the surface boundary of the other n-type portions 9b, 9c and 9d of region 9. Where such a p+ zone contacts the p-type body portion 17, it serves as a so-called "channel stop" zone.

An insulating layer 16 which may be of silicon oxide is present on the surface 15 of the body 1 and is permeable to the electromagnetic radiation 4 to be detected. A first-level electrode pattern 8, 10i a, 11a, 21, 22, 23, 24 (which may be formed from a layer of for example polycrystalline silicon having a comparatively high resistance) is present on the insulating layer 16. This electrode pattern provides the elongate resistive-electrodes 8 having their opposite ends interconnected by stripes 10a and 11a. In order to reduce the current dissipation along the electrodes 8 the sheet resistance of this electrode layer should be high. However, as will be described hereinafter, other portions of this electrode layer can be doped to have a lower sheet resistance. The pattern also provides the main electrode 22 of the buffer 12 and the electrodes 23 and 24 of the clock lines $\phi(1)$ and $\phi(3)$ of the four-phase CCD shift register 7, and a gate electrode 21 adjacent the output of the register 7. The electrodes 23 of clock line $\phi(1)$ are interconnected by a common part of this electrode layer. The electrodes 24 however are separate islands which are interconnected by a higher level of polycrystalline silicon or aluminium to form the clocking line $\phi(2)$. The output gate electrode 21 has a separate connection and is used to isolate the shift register channel from the n+ output zone 20 of register 7, for example when resetting the potential of zone 20 after read-out of charge-storage information. An insulating layer 45 is present over this first-level electrode-pattern 8, 10a, 11a, 21, 22, 23, 24.

A second-level electrode pattern 5, 10b, 11b, 13, 25–32 (which may be formed from a polycrystalline silicon layer having a comparatively low resistance, for example 40 ohm per square) is present over parts of the insulating layer 16 and the insulated electrode pattern 8, 10a, 11a, 21, 22, 23, 24. This second-level electrode-pattern provides the photogate electrodes 5 of each row of photosensitive elements 3, a gate electrode 30 associated with the anti-blooming drain electrode 13 for portions 9d, an input and output gate electrode 25 and 26 respectively of the buffer 12, the interconnected electrodes 27 of clocking line $\phi(2)$ of shift register 7 and the electrode islands 28 of clocking line $\phi(4)$ of shift register 7. All these electrode portions 5, 30, 25, 26, 27 and 28 are insulated from the underlying body portion and first-level electrode-pattern and are shown with solid cross-hatching in FIG. 1.

The stripe portions 10b, 11b and 32 contact the stripes 10a, 11a and 22 respectively of the first-level electrode layer along elongate windows in the insulating layer 45, see FIG. 4. This contact between the two levels of electrodes is indicated in the plan view of FIG. 1 by broken cross-hatching of portions 10b, 11b and 32. Similarly the stripe portion 29 contacts the electrode pattern 23 of the $\phi(1)$ clocking line of register 7 along a further elongate window in the insulating layer 45, see FIG. 4 and the broken cross-hatching in FIG. 1. As shown in the cross-section of FIG. 3 electrode portion 31 contacts the n+ output zone 20 of the n-type channel 9 of register 7 through a window in the insulating layer 16 and so provides a read-out member for the shift register 7. Similarly, electrode portion 13 of this second-level electrode pattern contacts each n+ zone of the anti-blooming drain extensions 9d of n-type channel 9 through windows in the insulating layer 16; this is indicated in FIG. 1 by localized broken cross-hatching of portion 13. The electrode stripe 13 then extends across the insulated resistive-electrode stripes 8 and over the insulating layer 16, see FIG. 1 and 4. A further insulating layer 35 is present over this second-level electrode-pattern 5, 10b, 11b, 13, 25–32.

For the sake of clarity, the insulating layers 16, 45 and 35 are shown without cross-hatching in the cross-sectional views of FIGS. 2, 3 and 4 and are not shown at all in the plan view of FIG. 1.

A third-level metallization pattern (which may be formed from a layer of, for example, aluminium) is present over parts of the two-level electrode structure and insulating layers. The cross-sections of FIGS. 2 and 4 shows stripe parts 36 of this aluminium pattern which are insulated from and extend along the length of the resistive electrode stripes 8 to shield the underlying n-type channel region 9 from the incident radiation 4. The aluminium stripes 36 may extend between a continuous area of aluminium provided over the electrode area 10a, b, and another area which is provided over and insulated from the electrode areas 13 and 30 of the anti-blooming drain.

These light-shield aluminium areas may be connected to, for example, the electrode area 16b, via a window in the insulating layer 35. The gaps between the stripes 36 expose the columns of photosensitive elements to the incident radiation 4. The envelope in which the device of FIGS. 1 to 4 is housed may include a mask to shield the other areas of the body 1 against the radiation 4. This third-level metallization pattern can also be used to interconnect the second-level electrode islands 28 of the shift register 7 to form the clocking line $\phi(4)$. It is also advantageous to use this third-level pattern to provide terminal-lines and terminal-areas for other portions of the device, for example, in contact with the lower level electrode lines. For the sake of clarity this third-level aluminium pattern is not shown in the plan view of FIG. 1.

Figure 5:
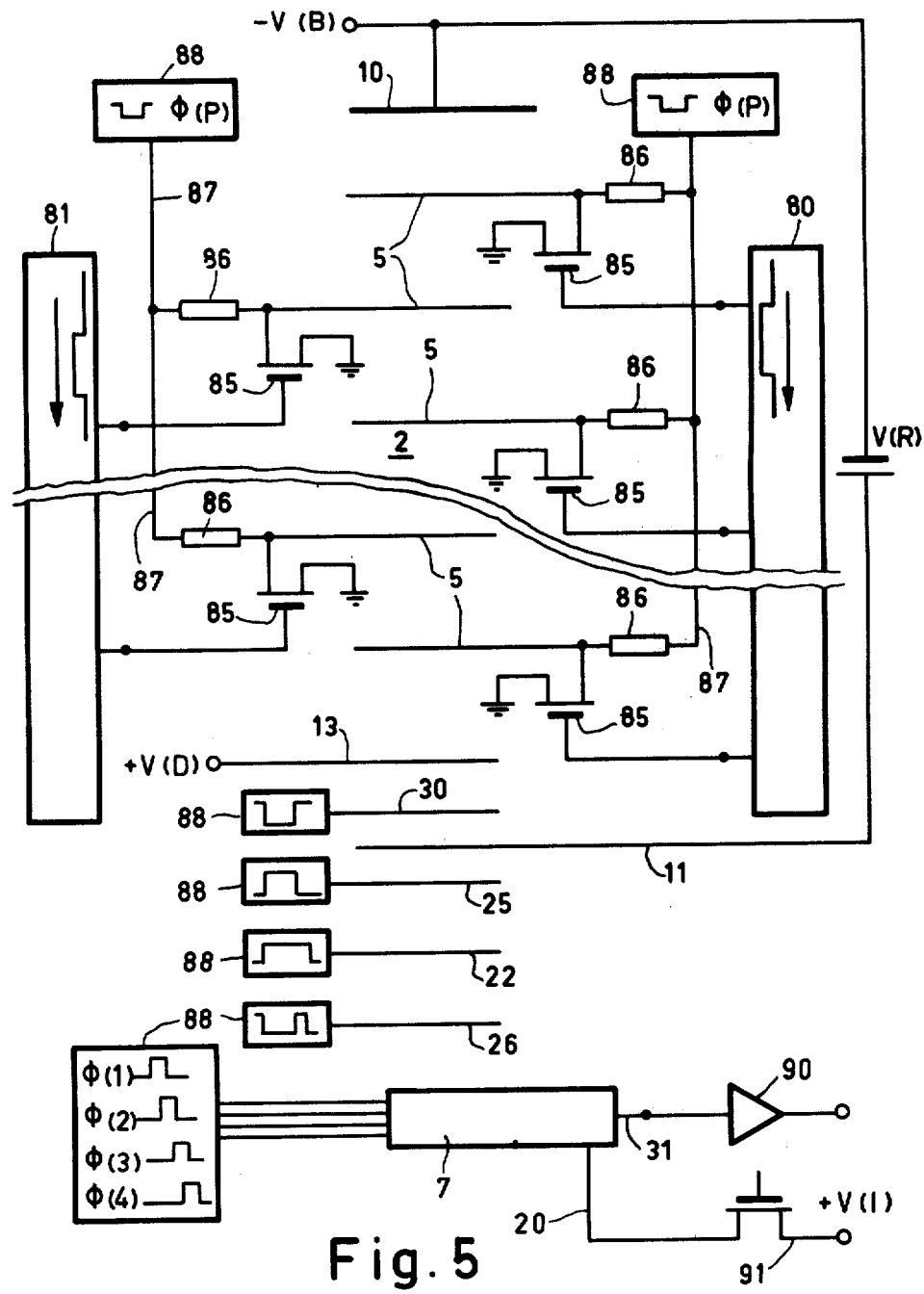
FIG. 5 is a schematic representation of an arrangement comprising the imaging device of FIGS. 1 to 4.

It will be appreciated that the first, second and third levels of metallization, the insulating layers, doped zones and regions may be provided at other portions of the body 1 outside the area shown in FIGS. 1 to 4 to provide peripheral circuitry for the imaging device. Thus, for example, each photogate electrode 5 may be connected to the output of a conventional insulated-gate field-effect transistor (IGFET) 85 having a load 86 (see FIG. 5), both of which may be formed in known manner in the body 1. When the transistor 85 is switched on, the potential of the associated photogate electrode 5 is reduced to, for example, earth potential from the potential $\phi(P)$ (for example 5 or 10 volts) applied to the line 87 at the opposite end of the load 86. Conventional IGFET shift-registers 80 and 81 can be formed in the portions of body 1 on both the left- and right-hand sides of the photosensitive array 2, for sequentially applying a voltage pulse to the gate electrodes to sequentially switch-on the transistors 85. In the arrangement shown in FIG. 5, alternate photogate electrodes 5 are connected to the same shift-register 80 or 81; however, if desired, alternate pairs of electrodes 5 may be connected to the same shift register 80 or 81 by using multiplex switches formed by IGFETS connected between the electrodes 5 and the terminals of the shift registers 80 and 81. The pulse generators 88 for providing a source of clock pulses as indicated in FIG. 5 can be of known type and may also be integrated in the same semiconductor body 1 as the photosensitive array 2, if so desired. Conventional charge-detection circuitry 90 (which may include, for example, an insulated-gate field-effect transistor, connected in a emitter-follower arrangement) can be provided adjacent the output of shift register 7 and connected to the output sense light 31. The electrode 31 and zone 20 may also form the source of an n-channel deep-depletion insulated-gate field-effect transistor 91 which acts as a reset switch for draining away an information-representative charge-packet after sensing and so resets the initial positive potential, $+V(I)$, of the sensing electrode 31 and zone 30. The use of field-effect transistors for sensing and resetting is described in the previously-mentioned British-Patent Specification No. 1,414,183 corresponding to U.S. Ser. No. 866,004, which is a continuation of U.S. Ser. No. 504,372, now abandoned, which in turn is a continuation of U.S. Ser. No. 299,748, now abandoned. The gate of such a reset transistors 91 may be formed by, for example, an adjacent portion of the first-level electrode pattern.

The area-imaging device of FIGS. 1 to 4 can be operated in the following manner. The p-type body portion 17 can be connected to earth potential (zero volts); fixed comparatively high positive potentials $V(D)$ and $V(I)$ respectively can be applied to the anti-blooming drain portion 9d of n-type region 9 via the connection 13 and to the shift-register n+output zone 20 via the reset field-effect transistor switch 91 of which zone 20 forms the source zone. Under these circumstances the p-n junction between the n-type region 9 and the p-type body portion 17 is reverse-biased, and mobile charge carriers are drained from the region 9 so that all portions 9a, 9b, 9c, 9d and 9e of region 9 are depleted of electrons throughout their thickness. A bulk charge-transfer channel for electrons can then exist in the interior of region 9. Information-representative electron packets can be transferred along said bulk channel in a known CCD manner by the potentials applied to the insulated electrodes provided over said channel to capacitively generate potential wells along said channel. The potentials applied to the shift-register electrodes 23, 24, 27 and 29, and to the buffer electrodes 25, 22 and 26 are clock voltages supplied from pulse generators 88 (FIG. 5). Fixed potentials are applied to the connections 10 and 11 of the resistive-electrodes 8, connection 11 being maintained at a positive potential $V(R)$ relative to connection 10. In a typical case such a potential difference may be, for example, 10 or 11 volts. The resulting potential difference along each resistive-electrode 8 produces in the underlying n-type channel portion 9a a drift field for electrons in the direction from the photosensitive array 2 to the shift-register 7.

As shown in the cross-section of FIG. 2 the photogate electrodes 5 form columns of MOS-capacitors between the resistive-electrode stripes 8. A positive potential $\phi(P)$ is applied to the photogate electrodes 5 via the lines 87 (FIG. 5). Under these circumstances a depletion layer and potential-well is formed adjacent the surface of the p-type body portion underlying each electrode 5. FIG. 2 also shows the resulting potential profile across this potential well (which is indicated by reference numeral 100) and into the n-type channel portion 9a. Where the p+ zones 14 are provided in the n-type portion 9a the channel potential is fixed at a potential level (reference numeral 101) which is less positive then the potential well 100 and may be for example $+3$ volts. Where the p+-zones 14 contact the p-type body portion 17 the potential is zero volts. At the locations of the photosensitive array 2 where the semiconductor body is not shielded by stripes 36, electron-hole pairs are generated in the body portion 17 by the incident radiation 4. The generated electrons are attracted to and collect in the potential wells 100 of the photogate capacitors. At the end of the integration time the potential of a first photogate-electrode 5 associated with a first row of elements 3 is temporarily reduced to zero volts, and the stored electron packet in each column of that row then flows to the left (in FIGS. 1 and 2) across the potential barrier 101 and into the potential well 102 below the resistive-electrode 8 adjacent the associated column. The potential of each photogate-electrode 5 can be reduced to zero volts in for example 2 micron-seconds by means of a voltage pulse which is shifted along the shift-registers 80 and 81 (FIG. 5) at the left and right of the array 2 and applied to the transistor 85 associated with that electrode 5. The size of the electron packets which can be stored under each photo-gate electrode 5 and can be transferred into the resistive-electrode transfer-lines 6 is determined by the intensity of the radiation incident adjacent said electrode 5. In addition the electrodes 5 which can be of doped polycrystalline silicon can be more transmissive for red light then for blue light. In this case, because the layer providing these photo-gate electrodes 5 covers a part of the photosensitive area between the shielding stripes 36, each photosensitive element 3 has a larger photosensitive area for red light than for blue light. This may be advantageous when such imaging devices are used for color-television cameras since with silicon imaging devices it is usual to filter infra-red radiation (to which silicon is sensitive) from the incident radiation, and such filtering usually also reduces undesirably the red component of the incident radiation 4 relative to the blue component.

The electrons transferred into the resistive-electrode transfer-lines 6 and corresponding to the charge-storage information of a row of elements 3 are transferred by the drift field along the channel in portion 9a towards the shift-register 7. The potential profile along the bulk channel in portions 9a, 9b and 9c is shown in FIG. 4. During the transfer of charge-storage information along the lines 6, the buffer input-gate electrode 25 and main buffer electrode 22 are clocked to a more positive potential than that applied to connection 11, to produce potential levels 103 and 104 of, for example, +15 volts and +20 volts respectively in the underlying n-channel. However the buffer output-gate electrode is clocked to a less positive potential to provide a level of, for example +5 volts in the underlying n-channel. The resulting potential profiles 103, 104 and 105 in channel portion 9b are indicated in broken outline in FIG. 4. Under these circumstances the buffer input gate from transfer lines 6 is open while the output gate to shift-register 7 is closed.

The potential gradient (reference numeral 102 in FIG. 4) along the transfer lines 6 produced by the potential difference V(R) is of course continuous, although a discontinuity is shown in FIG. 4 because only the top three and bottom two rows of photo-gate electrodes are shown for the sake of clarity. In a typical case, each resistive-electrode 8 (and thus each transfer line 6) may have a length of for example 4 mm and a width of for example 8 microns, whereas the photo-gate electrodes 5 may each have a width of for example 4 microns and be mutually spaced apart by for example 6 microns. The resistive electrodes may be spaced apart by for example 20 microns. A typical array 2 would consist of several hundred columns and several hundred rows. In a typical case, the potential difference along the transfer lines 6 may be 10 volts so that with a resistive-electrode length of 4 mm a constant drift field of 25 volts per cm is produced in the underlying channel portion 9a. This field transfers information-representative electrons into the buffer 12 (with input gate open and output gate closed) in a transit time which can be given by the expression $L_{\mu E}$ where L is the length of the line 6 along which transfer occurs, E is the drift-field, and $\mu$ is the mobility of electrons in said channel portion 9a. With the typical values given hereinbefore, the maximum transit time is typically 20 microseconds.

After a period of 20 microseconds allowed for the transfer to the buffer 12, the buffer input gate is closed by the clock voltage applied to electrode 25 which produces a less positive potential 103 (for example +5 volts) in the n-channel. After the shift-register 7 has shifted out the information of a previous row, the buffer output-gate electrode 26 and the shift-register $\phi(1)$ line electrodes 23 are clocked to more positive potentials to produce levels of, for example, +12 volts and +18 volts respectively in the underlying n-channel; the potential of the main buffer electrode 22 is then clocked to produce a less positive value (for example +6 volts) in the underlying n-channel so that the electron packets stored in the buffer 12 and corresponding to the charge-storage information of a row of the photosensitive array are simultaneously transferred to the read-out shift register 7. The resulting potential profiles are indicated by a solid line along the FIG. 4 cross-section of the buffer 12 and shift-register 7. The clock times may be approximately 1 microsecond.

Finally, the buffer output-gate is closed by decreasing the clock voltage applied to the electrode 26, and the charge information of the photosensitive element row is clocked along the shift-register 7 by known four-phase CCD action and sensed serially at the output 20 and 31. The clocking voltage levels applied to the shift-register electrodes may be such as to produce levels of, for example +8 volts and +18 volts in the underlying n-channels. During this reading of the shift-register 7 the next photo-gate electrode 5 is clocked to transfer the charge-storage information of the next row of photosensitive elements 3 to the buffer 12.

A photosensitive element 3 may be overexposed due to an excessively bright spot in the incident radiation pattern 4. In this case, even when its photo-gate electrode 5 is at its normal positive potential $\phi(P)$ of, for example, +5 volts for charge-storage, excessive charge-carriers are generated which cannot be stored at the potential well 100 but overflow into the charge-transfer line 6 and so are transported along the drift field towards the buffer 12 and read-out shift-register 7.

The anti-blooming means 9d, 30, 13 shown in FIG. 1 may be used for column anti-blooming, to prevent the excessive charge-carriers generated at an overexposed photosensitive element in one column from mixing with charge-carriers from elements in adjacent columns. In this case a fixed potential may be applied to the anit-blooming gate electrode 30 to determine across the drain extension portion 9d a potential of, for example +13 volts, over which excessive charge-carriers can flow to the positively-biased drain connection 13 from the charge-transfer lines 6, before said carriers can be introduced into buffer 12 and the read-out shift register 7. Such a potential barrier could also be obained by means of an implanted zone, instead of using the gate structure 30.

The anti-blooming structure 9d, 30, 13 shown in the device structure and the arrangement of FIGS. 1 to 5 has the advantage that it may also be used for point anti-blooming. In this case, the excessive charge-carriers are transported along the same transfer lines 6 as the charge-storage information of each row but during different time intervals. The following timing sequence may be used, for example, in a television camera application having point anti-blooming.

At instant $t_o$: the input and output gates of buffer 12 are closed, and the charge-storage information of a row of photosensitive elements is being readout via the shift-register 7; at all the photo-gate electrodes 5 the normal positive voltage $\phi(P)$ for charge-storage and integration, for example 5 volts, is increased by for example a further 5 volts. This can be effected by means of pulse generator 85 connected to line 87, see FIG. 5. As a result of this increased positive potential on electrode 5, these photosensitive elements of the array 2 which are overexposed now integrate charge again without overflow of excessive carriers; the anit-blooming gate 30 is fully open at a high positive potential, so that the transfer channels 9a are drained of excessive charge-carriers via the positively-biased drain connections 13.

At $(t_o+2\ C)$ microseconds: the transfer channels 9a are empty; the anit-blooming gate electrode 30 is clocked to reduce the potential level in the underlying n-channel to a normal value (for example +13 volts) which is less positive than that in the n-channel underlying connection 11; electrode 25 is now clocked to open the input-gate of buffer 12; the potential of the next photo-gate electrode line 5 to be selected is reduced to zero, in for example 2 microseconds, so that the signal packets of that row are transferred to the transfer line 6 and drift to the buffer 12 within 20 microseconds.

At $(t_o+40)$ microseconds: the electron packets of the selected row are now situated in the buffer 12; the buffer input-gate is closed, and the anti-blooming gate electrode is clocked again to its higher potential; the potential of all the photo-gate electrodes 5 may now be reduced to their normal positive potential $\phi(P)$ for integration, for example +5 volts. The additional charge which will be present in overexposed points will now overflow into the charge-transfer lines and will drift towards the anti-blooming gate.

At $(t_o+52)$ microseconds: the shift-register 7 is now empty; the output gate of the buffer 12 is now opened, and the potential of the buffer electrode 22 is reduced so that the charge information of the row stored in the buffer 12 is transferred within for example 2 microseconds beneath the $\phi(1)$ electrodes 23 of the shift-register 7. After this transfer, the output gate of the buffer 12 is closed again. It is to be noted that in the case in which the potential of the photogate electrodes 5 were not reduced to their normal potential at $(t_o+40)$, said potential could also be so reduced now. Thus, the whole cycle can be carried out within a total line time of 64 microseconds, and the information in the register 7 can be read-out in the active line time.

At $(t_o+64)$ microseconds: the whole procedure starts again. By means of this point anti-blooming arrangement, blooming can be avoided unless so many electrons are collected in one potential well between $t_o$ and $(t_o+40)$ or $(t_o+52)$ microseconds, that this well overflows in spite of the additional 5 volts which are applied. However, it has been found that assuming a maximum signal packet can be stored with +5 volts on the electrode 5, then the additional +5 volts should accommodate an overexposure of more than 400 times the maximum signal, without blooming.

Figure 6:
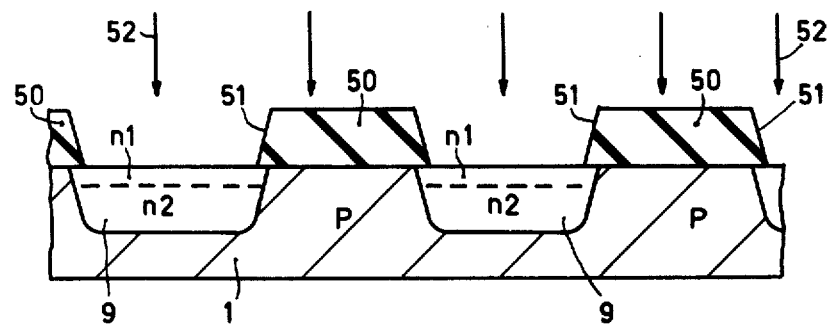
FIGS. 6 and 7 are cross-sections of the semiconductor body portion of FIG. 2 at different stages in manufacture of the device.

It will be appreciated that the imaging device of FIGS. 1 to 4 can be manufactured using several different processing techniques known to those skilled in the semiconductor device art. Therefore a method of manufacturing the device will now be described only in outline and by way of example with reference to FIGS. 6 to 8.

The starting material may be a p-type monocrystalline silicon body 1 having a resistivity of for example on the order of 30 ohm.cm. On one major surface 15 of the body 1 a masking layer 50 is provided having therein a window 51 which corresponds to the outline of the n-type region 9 shown in FIG. 1. The portions 9a may be, for example, 9 microns wide, and the portions 9e may be a lateral extension of, for example, 5 microns. The portions 9a may have a pitch of, for example, 28 microns. Donor dopant is then introduced into the p-type body 1 through window 51 to obtain said n-type region 9. This may be effected by implantation of donor ions (for example phosphorus) as indicated by the arrows 52 in FIG. 6. A double implant may be performed to provide a higher doping $n_1$ in the surface portion in addition to the background doping $n_2$ throughout the region 9. As is known, in this manner a bulk transfer channel can be formed with an advantageous doping profile, for example, as described in co-pending British Patent Application No. 11974/74 corresponding to published Dutch Application No. 7303778 and U.S. Pat. No. 4,012,759. The ion doses may be for example $2\times10^{12}$ ions/sq. cm. for $n_1$ and $5\times10^{11}$ ions/sq. cm. for $n_2$, and the $n_1$ and $n_2$ zones may have depths of for example 0.3 to 0.4 microns and 3 microns respectively. The masking layer 50 may be of deposited silicon oxide and may also serve to improve the quality of the silicon surface 15 by gettering during a subsequent annealing treatment.

The mask 51 may then be replaced by an insulating layer 16. However, the layer 16 may also be provided before the mask 51 and the donor implants. As described in co-pending British Patent Application No. 38587/75 corresponding to published Dutch Application No. 7412567 and U.S. Pat. No. 4,077,112, such an insulating layer may be of silicon oxide covered by a thin layer of silicon nitride. The total thickness may be, for example, approximately 0.12 microns.

If desired a low-dose p-type ion implant (for example $10^{12}$ ions/sq. cm.) may be made into the surface of the body 1 in order to have n-channel enhancement IGFET devices for the shift-registers 80 and 81 for clocking the photogates and to more precisely determine the potential of the p-type surface portions in the photosensitive array 2 and provide there a slight drift field for electrons in a direction away from the silicon-insulator interface.

A layer of high-ohmic polycrystalline silicon (for example having a resistance of 6,000 ohms per square and a thickness of 0.6 microns) is then deposited on the layer 16, from which by photolighographic and etching techniques the first-level electrode portions, for example portions 8, 10a, 11a, 21, 22, 23 and 24 are provided. The exposed surfaces of these remaining portions of the polycrystalline silicon layer can then be oxidized, for example to a thickness of at least 0.3 micron to provide insulating layer 45. If desired, the exposed silicon nitride portion of layer 16 may then be etched away where it does not underlie the insulated first-level electrode portions, by using a selective etchant.

Figure 7:
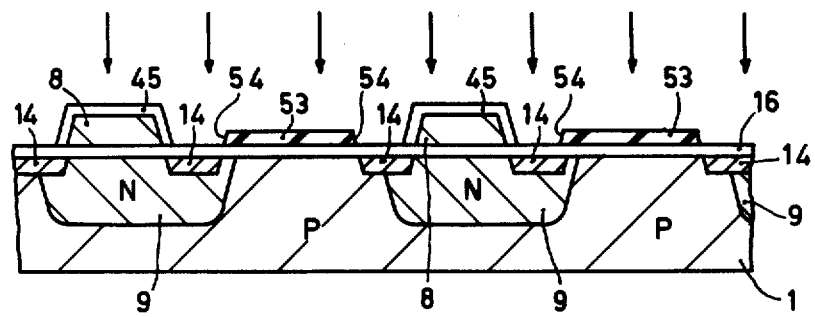
Figure 8:
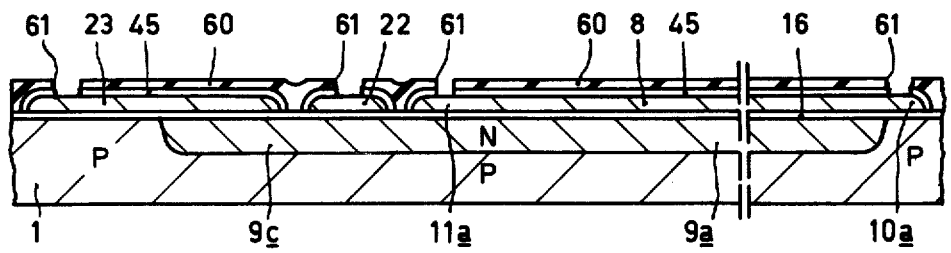
FIG. 8 is a cross-section of the semiconductor body portion of FIG. 4 at a subsequent stage in manufacture.

A masking layer 53 may then be provided over the structure and having stripe-shaped windows 54 which expose the insulated electrode stripes 8 in the area of the array 2. The gaps between the edge of these windows in mask 53 and the edge of the insulated electrode stripes 8 can then be used to define the area in which the p+stripe zones 14 are implanted. These gaps may be typically 4 microns wide. The layer 53 also masks other portions of the body against implantation. An ion dose of for example $2\times10^{13}$ acceptor ions/sq.cm. may be employed with an implantation energy sufficient to penetrate through the insulating layer 16 into the body 1 without penetrating through the insulating layer 45. This implantation is illustrated in FIG. 7. The mask 53 which may be for example of metal or photoresist is subsequently removed. If desired, the p+ zones 14 can also be provided before providing the first-level electrode pattern.

By photolithography a photoresist mask 60 is now provided having windows 61 at the areas where the insulating layers 45 and 16 are to be provided with contact windows. Such windows occur, for example, where the resistive electrode connections 10a and 11a, the buffer electrode 22 and the shift-register $\phi$ (1) clock electrode 23 are to be contacted by the second-level electrode pattern, and where the anti-blooming drain extensions 9d of region 9 and the shift-register sense output 20 of region 9 are also to be contacted by this second level. These contact windows are then etched in the insulating layers 45 and 16 using the photoresist pattern 60 as an etchant mask, see FIG. 3. The mask 60 is then removed. A second layer of polycrystalline silicon is then deposited to a thickness of for example 0.6 microns. This layer is then doped, for example by phosphorus diffusion to obtain a sheet-resistance of 20 to 40 ohms per square. This dopant diffusion also provides at the contact windows in insulating layers 45 and 16 highly doped n-type zones both in the first polycrystalline silicon layer portions such as portions 10a, 11a, 22 and 23 and in the body 1 to form for example the n+ zone 20 and a similar zone at each of the anti-blooming drain contact areas.

By photolithographic and etching techniques the second-level electrode portions such as portions 5, 10b, 11b, 13, 25 to 32 are formed from this second polycrystalline silicon layer. The exposed surfaces of these layer portions can then be lightly oxidized. If the exposed silicon nitride portion of layer 16 has not been previously removed it may now be etched away where it does not underlie the insulated first or second electrode portions, by using a selective etchant.

Subsequently, a silicon oxide layer 35 can be deposited over the structure. Using photolithographic and etching techniques contact windows can then be opened in the deposited oxide layer where for example the third-level pattern of aluminium is to contact underlying portions. Aluminium can then be deposited over the structure and formed into the desired third-level pattern by again using photolithographic and etching techniques. If desired a layer for scratch protection of the photosensitive array may be provided over the final structure.

Such an imaging device having for example a 200 column by 200 row array may be fabricated on a 4.2 mm by 5.6 mm silicon chip.

It will be appreciated that many modifications are possible for imaging devices n accordance with the present invention. Instead of  ng the same transfer line 6 for both the charge-storag  information and excessive charge-carriers resulting from overexposure, separate transfer lines may be provided under the same resistive electrode stripe 8. Such a modification is illustrated in the cross-section of FIG. 9 which is of a body portion similar to that of FIG. 2. Similar portions are designated by the same reference numerals and letters in each Figure. In this case, the n-type portions 9a are wider and are divided along their length by one of the p+ zones 14 so as to form two transfer-lines which have graded potential wells indicated by references 102 (a) and 102 (b) in FIG. 9 and serve respectively for the transfer of charge information derived from the element 3 on the right of the line and for the transfer of excessive charge-carriers from an overexposed element 3 on the left of the line. The anti-blooming threshold potential is determined in this case by a less highly-doped p-type implanted zone 65. The zone 65 forms an incorporated potential barrier 110 which has a higher potential value than that resulting from the p+ zones 14 in the n-type region 9 and which may be for example 4 to 5 volts. The anti-blooming gate electrode 30 shown in FIG. 1 is now no longer needed, and each anti-blooming transfer line is connected directly to its anti-blooming drain 9d which is still contacted by the electrode stripe 13. The broken line profile shown in FIG. 9 represents the situation when the charge-storage information is transferred to the channel portion 9a by reducing potential $\phi$ (P).

In the manufacture of this device at least the p+ zone 14 below each resistive-electrode stripe 8 must be provided before depositing the first-level electrode material.

A modification of the photo-sensitive element structure is illustrated in FIGS. 10 and 11. Similar portions are once again denoted by the same reference numerals and letters. In this case the surface-adjacent part of each photosensitive element 3 is formed by an enlarged lateral extension 9f of the n-type channel region portion 9a instead of a surface-adjoining part of the p-type body portion 17. In this case, a deeper depletion layer can be formed under the photo-gate electrodes 5 for each photosensitive element so that charge carriers generated deeper in the body 1 by the incident radiation 4 can be more reliably collected in the potential well associated with this depletion layer. This is particularly important for the longer wavelength radiation such as red-light which can penetrate more deeply in the body 1 than shorter wavelengths. In addition the thermal generation of charge-carriers at the surface will be small, because the surface is in accumulation.

The regions 9f are connected to the main portions 9a by a narrower neck portion 9k, as shown in FIG. 11. Highly-doped p-type zone 14 now extends around each photosensitive area both across the portions 9k and along the boundary of each n-type portion 9f with the p-type body portion 17. Thus, the zone 14 defines the potential barriers for electrons around the potential well formed at each element 3. Where the zone 14 is present in the n-type region 9 (i.e. at the portions 9k) the potential barrier for electrons is less (for example +3 volts) than where the zone 14 contacts the p-type body portion 17 (for example zero volts). Thus, when the photogate electrode potential $\phi$ (P) is switched to zero the stored electrons transfer from region portion 9f through portion 9k into the transfer-lines 6. For the sake of clarity the insulated electrode structure is not shown in the plan view of FIG. 11, the n-type region 9a, f, k, is shown in solid outline, and the shallow p-type zone 14 in dotted outline. If desired, a shallow low dose p-type implant may also be effected in these photosensitive elements 3 at the surface of the n-type portions 9f and using both the insulated resistive-electrodes 8 and the photogate electrodes 5 as an implantation mask in that area. Such an implantation can serve to reduce surface leakage currents in these elements by reducing electron-generation at the surface and can incorporate a drift field which enhances transport of photo-generated electrons from the surface to the potential well under the photo gate 5.

It has been found that by using resistive-gate transfer-lines with drift-fields for read-out from a photosensitive element array the signal-to-noise ratio of an imaging device can be generally improved particularly when using bulkchannel transfer lines.

It will be evident that many other modifications are possible. Thus, for example the geometry, doping, resistivity and other properties of various portions can be chosen within wide limits. The conductivity type of the various semiconductor regions may all be simultaneously changed to the opposite type while of course also changing the polarity of the applied voltages, Other charge-transfer and storage media besides silicon, and other insulating layer materials and electrode materials may of course be used.

Instead of producing the drift-field in the transfer lines 6 by a potential-difference along a resistive electrode 8, a varying threshold effect may be employed. Thus, for example a less resistive electrode 8 may be used having a single connection for applying a potential thereto; in such a case a drift-field below this electrode 8 can be obtained by providing an n-type doping gradient along the transfer channel portion 9a (for example by implantation) or by incorporating (for example by implantation) in the insulating layer 16 a quantity of charge which varies along the length of the transfer line 6, or by having an insulating layer 16 the thickness of which decreases with distance along the line 6. However, such varying-threshold arrangements are at present generally much more difficult to manufacture in a readily reproducible manner.

The transfer lines 6 need not be straight, but instead may meander. Both the rows and columns of the photosensitive array 2 and the transfer lines 6 and photogate electrodes 5 need not be mutually perpendicular. Imaging devices in accordance with the present invention could be used for detecting radiation patterns not visible to the human eye. Instead of applying a fixed potential difference V (R) along the resistive electrodes 8, the potential difference for charge-transfer may be provided by clocking the potential at one end of electrode 8 relative to the potential at the other end; in this case when the lines 6 are not being used for charge-transportation, both connections 10 and 11 may be at the same potential so that a further reduction is possible in the small amount of heat-dissipation resulting from the small current flow along the electrodes 8 when said potential difference is present. Such a clock voltage can be effected by providing a further pulse generator 88.

What is claimed is:

1. An imaging device comprising a semiconductor body, an array of photosensitive elements arranged in rows and columns at a first portion of said body for generating and storing mobile charge carriers in response to incident radiation, first means for transferring stored charge carriers from said array to a second portion of said body, said first means comprising a plurality of charge-transfer lines interdigitated with the columns of said array, second means for defining at said second portion of the body a charge-transfer shift register for receiving from said first means a parallel supply of the transferred charge information from a row of said array and for providing a sequential output of said information, and means for transferring the charge storage information from each row of the array separately into said transfer lines, each of said transfer lines comprising an elongate resistive electrode which is insulated from the underlying portion of said body and which extends alongside an associated column of said array, said resistive electrode having connections for applying a potential difference along said resistive electrode to produce in said underlying body portion a drift field in the direction of said shift register for transporting said mobile charge carriers towards said shift register, the photosensitive elements of each row including a common photo-gate electrode which extends transverse to said charge-transfer lines and which is insulated from said resistive electrodes and from the underlying semiconductor surface, and said photo-gate electrodes covering only part of the area of the photosensitive element array and serving both to provide at each photosensitive element a poential well at which said charge carriers are stored and to transfer the charge-storage information of a row of said photosensitive elements to said resistive electrode transfer lines.

2. An imaging device according to claim 1, in which said photo-gate electrodes are of doped polycrystalline silicon and are more transmissive for red light than for blue light.

3. An imaging device according to claim 2, wherein the portion of the body underlying each of said resistive electrodes and in which said drift field is produced is a surface-adjoining semiconductor region of a first type conductivity which is surrounded by a semiconductor body portion of a second type conductivity opposite to that of the first and which can be fully depleted without avalanche multiplication in order to allow transfer of said charge-storage information through said region as charge carriers of said first type conductivity which drift along the interior of said region below said resistive electrode.

4. An imaging device according to claim 3, wherein said semiconductor region of the first type conductivity comprises a more highly doped surface zone which extends along and below the elongate resistive electrode.

5. An imaging device according to claim 3, wherein said region of the first type conductivity underlying each resistive electrode has a lateral extension of said first type conductivity between the photosensitive element array and said shift register, which lateral extension is provided with a drain connection and serves to drain away from the resistive electrode transfer line excessive charge-carriers of said first type conductivity produced at a photosensitive element in the column associated with said transfer line.

6. An imaging device according to claim 5, wherein said excessive charge-carriers are transported along the same transfer line as said charge-storage information, and a gate is present between said drain connection and said transfer line to permit passage of said excessive charge-carriers to said drain connection.

7. An imaging device according to claim 5, wherein a surface-adjoining doped zone of said second type conductivity extends along said region of the first type conductivity under each of the resistive electrodes to provide on one side a first charge-transfer line adjacent one column of photosensitive elements for transport of charge information and on the other side a second charge-transfer line adjacent the adjacent column of photosensitive elements and connected to said drain for transport of said excessive charge carriers from said adjacent column.

8. An arrangement comprising an imaging device according to claim 6, wherein at least during the transfer of the charge-storage information of a row through said resistive-electrode transfer line, excessive charge-carriers produced at a photosensitive element are temporarily stored in said photosensitive element by temporarily increasing the potential applied to the photosensitive elements, after which said potential is reduced to a level for storing the charge-carriers corresponding to the information to be read and for transferring said excessive charge-carriers to said drain connection via said resistive-electrode transfer lines and said gate.

9. An imaging device according to claim 3, wherein said potential wells of the photosensitive elements are formed in surface-adjoining parts of said body portion of the second type conductivity between said regions of said first type conductivity, and the barrier between the potential well and the adjacent regions of said first type conductivity is less one one side than on the other.

10. An imaging device according to claim 3, wherein said region of the first type conductivity of each of said transfer lines comprises lateral extensions which form the surface-adjacent part of the photosensitive elements where said potential wells are formed, a surface-adjoining zone of said second type conductivity being present in said region of the first type conductivity and around the photosensistive area of said region so that a potential barrier can be formed around said area which shows a decrease adjacent the transfer line part of said region.

11. An imaging device comprising a semiconductor body, an array of photosensitive elements arranged in rows and columns at a first portion of said body for generating and storing mobile charge carriers in response to incident radiation, first means for transferring stored charge carriers from said array to a second portion of said body, said first means comprising a plurality of charge-transfer lines interdigitated with the columns of said array, second means for defining at said second portion of the body a charge-transfer shift register for receiving from said first means a parallel supply of the transferred charge information from a row of said array and for providing a sequential output of said information, and means for transferring the charge storage information from each row of the array separately into said transfer lines, each of said transfer lines comprising an elongate resistive electrode which is insulated from the underlying portion of said body and which extends alongside an associated column of said array, said resistive electrode having connections for applying a potential difference along said resistive electrode to produce in said underlying body portion a drift field in the direction of said shift register for transporting said mobile charge carriers towards said shift register, said first means comprising a buffer for temporarily storing the charge-storage information from a row before introduction of said information into said shift register, said buffer having an input gate from the resistive-electrode transfer lines and an output gate to the shift register, the photosensitive elements of each row including a common photo-gate electrode which extends transverse to said charge-transfer lines and which is insulated from said resistive electrodes and from the underlying semiconductor surface, said photo-gate electrodes covering only part of the area of the photosensitive element array and serving both to provide at each photosensitive element a potential well at which said charge carriers are stored and to transfer the charge-storage information of a row of said photosensitive elements to said resistive electrode transfer lines, and the charge information of the next row being transferred to said buffer during the read-out of the charge-storage information of one row via the shift register.

* * * * *